(12) United States Patent
Kidoguchi

(10) Patent No.: US 10,886,206 B2
(45) Date of Patent: Jan. 5, 2021

(54) LEAD FRAME, RESIN-EQUIPPED LEAD FRAME, OPTICAL SEMICONDUCTOR DEVICE, AND METHOD FOR MANUFACTURING LEAD FRAME

(71) Applicant: OHKUCHI MATERIALS CO., LTD., Kagoshima (JP)

(72) Inventor: Shunichi Kidoguchi, Kagoshima (JP)

(73) Assignee: OHKUCHI MATERIALS CO., LTD., Kagoshima (JP)

( * ) Notice: Subject to any disclaimer, the term of this patent is extended or adjusted under 35 U.S.C. 154(b) by 0 days.

(21) Appl. No.: 16/523,240

(22) Filed: Jul. 26, 2019

(65) Prior Publication Data

US 2020/0035889 A1 Jan. 30, 2020

(30) Foreign Application Priority Data

Jul. 26, 2018 (JP) .................... 2018-140783

(51) Int. Cl.
*H01L 23/495* (2006.01)
*H01L 33/62* (2010.01)
*H01L 33/60* (2010.01)
*H01L 33/52* (2010.01)

(52) U.S. Cl.
CPC ........ *H01L 23/49582* (2013.01); *H01L 33/60* (2013.01); *H01L 33/62* (2013.01); *H01L 33/52* (2013.01)

(58) Field of Classification Search
CPC ......... H01L 23/49534; H01L 23/49582; H01L 33/52; H01L 33/60; H01L 33/62
See application file for complete search history.

(56) References Cited

U.S. PATENT DOCUMENTS

2005/0196634 A1* 9/2005 Abe .................... C22C 9/00
428/615
2016/0181493 A1* 6/2016 Miki ................ H01L 33/647
257/99
2018/0114744 A1* 4/2018 Brandl ............... H01L 33/486

FOREIGN PATENT DOCUMENTS

| JP | 2007-12822 | 1/2007 |
| JP | 2012-209367 | 10/2012 |
| JP | 2014-179492 | 9/2014 |
| JP | 2018-22817 | 2/2018 |

* cited by examiner

*Primary Examiner* — Cheung Lee
(74) *Attorney, Agent, or Firm* — Wenderoth, Lind & Ponack, L.L.P.

(57) ABSTRACT

A lead frame for use in an optical semiconductor device has a die pad portion on which an optical semiconductor element is mounted and a lead portion electrically connectable with the optical semiconductor element. A surface on a lead frame substrate forming a part of or an entirety of the die pad portion and the lead portion is laminated with a glossy Ni plating layer having a gloss of 2.0-3.5 and a noble metal plating layer including an Ag plating layer, as an uppermost layer, having a gloss of 1.6 or more.

12 Claims, 8 Drawing Sheets

NORMAL PORTION

UNEVENLY PLATED PORTION

NORMAL PORTION

UNEVENLY PLATED PORTION

PROTECTIVE LAYER
Ag PLATING LAYER
Ni PLATING LAYER
Cu SUBSTRATE

LEAD FRAME, RESIN-EQUIPPED LEAD FRAME, OPTICAL SEMICONDUCTOR DEVICE, AND METHOD FOR MANUFACTURING LEAD FRAME

CROSS REFERENCE TO RELATED PATENT APPLICATIONS

This application claims the benefit of Japanese Patent Application No. 2018-140783 filed in Japan on, Jul. 26, 2018, the contents of which are incorporated herein by reference.

BACKGROUND OF THE INVENTION

1) Field of the Invention

The present invention relates to a lead frame, a resin-equipped lead frame, an optical semiconductor device, and a method for manufacturing a lead frame.

2) Description of Related Art

Optical semiconductor devices having optical semiconductor elements mounted thereon are used in various devices such as ordinary lighting fittings, and displays built in televisions, mobile phones and OA devices. Regarding these optical semiconductor devices, there have been developed, for the purpose of meeting demands for thickness reduction and cost reduction of the products, packages in which optical semiconductor elements are mounted by use of lead frames and are subjected to resin-sealing.

In general, in an optical semiconductor device using a lead frame, the lead frame has a die pad portion on which an optical semiconductor element is to be mounted and a lead portion spaced around the die pad portion, and the outermost surface of the lead frame substrate, which forms the entirety or a part of the die pad portion and the lead portion, is plated with a noble metal. The optical semiconductor element is mounted on the die pad portion, and the optical semiconductor element and the lead portion are joined together via a bonding wire or the like. A periphery of the die pad portion, on which the optical semiconductor element is mounted, and the lead portion are surrounded by a reflector resin portion made of a resin that reflects light. A sealing resin portion filled with a transparent resin is formed in a spatial region surrounded by the reflector resin portion and accommodating the optical semiconductor element, the bonding wire and so on.

In the optical semiconductor device, it is important that light emitted from the optical semiconductor element and traveling sideward and downward be efficiently reflected by the reflector resin portion as well as by the surface of the lead frame surrounded by the reflector resin portion, to be emergent in a predetermined direction.

Therefore, the outermost surface of the lead frame substrate, which serves as the die pad portion and the lead portion upon which the sealing resin portion made of transparent resin is formed, is plated with a noble metal coating with a high reflectance for light, to reflect light emitted from the optical semiconductor element and traveling downward. For an uppermost plating layer in the noble metal plating layer, a silver coating with a high reflectance for light is generally adopted.

There is disclosed, for example in JP Patent Application Laid-open No. 2012-209367 and JP Patent Application Laid-open No. 2014-179492, the configuration of coatings in which the outermost layer of a noble metal plating layer is a silver plating layer in a lead frame used for such an optical semiconductor device.

For example, JP Patent Application Laid-open No. 2012-209367 describes a lead frame having a coating configuration in which a Ni plating layer, an Au strike plating layer, and an Ag plating layer are sequentially made to laminate the surface of a lead frame substrate, which is to form a die pad portion and a lead portion, to form a coating surface achieving reflection characteristics such that a reflectance is 92% or more and a gloss is 1.40 or more.

Also, JP Patent Application Laid-open No. 2014-179492 describes a lead frame having, for preventing deterioration of an Ag plating layer owing to sulfurization corrosion, a coating configuration in which three layers composed of a glossy Ni plating layer, a Pd plating layer, and an Ag plating layer, or four layers composed of glossy Ni plating layer, a Pd plating layer, an Au plating layer and an Ag plating layer are formed on the surface of the metal frame substrate, so that the outermost Ag plating layer has a gloss of 1.60 or more.

As described above, the coating surface of a lead frame for an optical semiconductor device is required to efficiently reflect light from the optical semiconductor element, and in recent years, it has come to be required that the gloss of the coating surface be 1.6 or more as in the lead frame described in JP Patent Application Laid-open No. 2014-179492.

When the gloss is high, a coating surface of a lead frame for an optical semiconductor device looks pale black like a specular surface. For this reason, in a lead frame for an optical semiconductor device in which a gloss is 1.6 or higher, surface anomalies in appearance of the coating surface are more easily found than in a case of a lead frame for a common IC which does not need to have a gloss of 1.6 or higher, and some of them have come often to be detected as defects of lead frame products. In particular, in a lead frame used for an optical semiconductor device such as an LED, unevenness or the like considered to be caused by materials has come to be easily found. Although the unevenness or the like of the coating surface does not affect the function of the lead frame, it is judged as a defect in appearance and thus deteriorates the productivity of the lead frame products.

Also, noble metals conventionally used to increase the gloss of coating surfaces are expensive, and thus it is desirable to make a coating thickness of noble metals as thin as possible.

The present invention has been made in view of the above problems. An object of the present invention is to provide a lead frame, a resin-equipped lead frame, an optical semiconductor device, and a method for manufacturing a lead frame that maintain the gloss of the coating surface at 1.6 or more, prevent defects in appearance such as unevenness of the coating surface, and allow the coating thickness of noble metals used for raising the gloss of the coating surface to be thin for cost reduction.

SUMMARY OF THE INVENTION

A lead frame according to one aspect of the present invention is for use in an optical semiconductor device, and includes a die pad portion on which an optical semiconductor element is to be mounted and a lead portion electrically connectable with the optical semiconductor element, wherein a surface on a lead frame substrate forming at least a part of or an entirety of the die pad portion and the lead portion is laminated with plating layers including a glossy Ni plating layer having a gloss of 2.0 or more and 3.5 or less and a noble metal plating layer including an Ag plating layer having a gloss of 1.6 or more and arranged as an uppermost layer.

A method according to one aspect of the present invention for manufacturing a lead frame to be used in an optical semiconductor device includes a process of laminating a surface on a lead frame substrate with a glossy Ni plating layer having a gloss of 2.0 or more and 3.5 or less and a noble metal plating layer including an Ag plating layer that has a gloss of 1.6 or more and that is arranged as an uppermost layer, the surface being of at least a part of or an entirety of sites that correspond to a die pad portion on which an optical semiconductor element is to be mounted and a lead portion electrically connectable with the optical semiconductor element.

According to the present invention, it is possible to attain a lead frame, a resin-equipped lead frame, an optical semiconductor device, and a method for manufacturing a lead frame that maintain the gloss at the coating surface of 1.6 or more, prevent defects in appearance such as unevenness of the coating surface, and allow the coating thickness of noble metals used for raising the gloss of the coating surface to be thin for cost reduction.

These and other features of the present invention will become apparent from the following detailed description of the embodiments when taken in conjunction with the accompanying drawings.

BRIEF DESCRIPTION OF THE DRAWINGS

FIGS. 2A-2B are explanatory diagrams that schematically show the coating configuration of a lead frame for an optical semiconductor device according to an embodiment of the present invention, in which FIG. 2A shows an example and FIG. 2B shows another example.

FIG. 5A is an image showing a state of a surface of an Ag plating layer in the normal portion, FIG. 5B is an image showing a state of a surface of the Ag plating layer in the unevenly plated portion, FIG. 5C is a scanning ion microscopic image showing a state of a cross section of the plating layers in the normal portion, and FIG. 5D is a scanning ion microscopic image showing a state of a cross section of the plating layers in the unevenly plated portion.

FIG. 7A is a diagram that shows crystal grains at the unevenly plated portion in the plating layers according to the prior art, and FIG. 7B is a diagram that shows crystal grains at the normal portion in the plating layers according to lead frame of the embodiment.

DETAILED DESCRIPTION OF THE EMBODIMENTS

Figure 1:
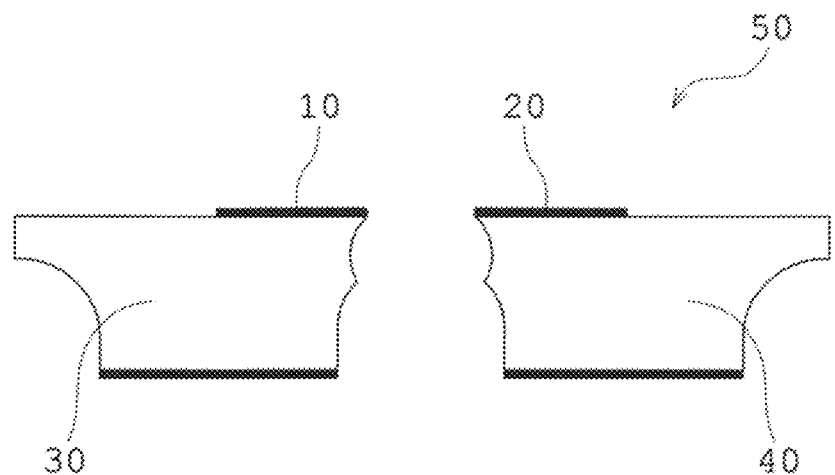
FIG. 1 is a cross-sectional view that schematically shows a configuration of a lead frame for an optical semiconductor device according to an embodiment of the present invention.

Preceding the description of embodiments, the function and effect of the present invention will be described.

A lead frame according to one aspect of the present invention is for use in an optical semiconductor device, and includes a die pad portion on which an optical semiconductor element is to be mounted and a lead portion electrically connectable with the optical semiconductor element, wherein a surface on a lead frame substrate forming at least a part of or an entirety of the die pad portion and the lead portion is laminated with plating layers including a glossy Ni plating layer having a gloss of 2.0 or more and 3.5 or less (i.e., in a range of 2.0 to 3.5, inclusive) and a noble metal plating layer including an Ag plating layer having a gloss of 1.6 or more and arranged as an uppermost layer.

Arranging the glossy Ni plating layer to have a gloss of 2.0 or more and 3.5 or less makes it possible to prevent the surface of the Ag plating layer from caving and from having plating unevenness without affecting the gloss of the Ag plating layer.

In the lead frame according to one aspect of the present invention, the coating thickness of the Ag plating layer preferably is 0.3 μm or more and 2.5 μm or less (i.e., in a range of 0.3 μm to 2.5 μm, inclusive).

Forming the uppermost layer, or the Ag plating layer having the gloss of 1.6 or more to have a coating thickness in this range contributes to maintaining the gloss of 1.6 at the coating surface, prevents plating unevenness on the coating surface, and allows the coating thickness of noble metal to be thin, to achieve cost reduction.

Here, in the lead frame according to one aspect of the present invention, the surface roughness in terms of Ra of the glossy Ni plating layer preferably is 0.02 μm or more and 0.05 μm or less (i.e., in a range of 0.02 μm to 0.05 μm, inclusive.

This configuration makes it possible to prevent plating unevenness on the coating surface without being affected by the size of underlying crystal grains or lowering the gloss of the Ag plating layer.

In the lead frame according to one aspect of the present invention, the coating thickness of the glossy Ni plating layer preferably is 0.5 μm or more and 3.0 μm or less (i.e., in a range of 0.5 μm to 3.0 μm, inclusive).

In the lead frame according to one aspect of the present invention, the crystalline orientation of the glossy Ni plating layer preferably is such that the plane index (111) is dominant over the plane index (200).

In the lead frame according to one aspect of the present invention, the reflectance at the surface of the Ag plating layer for 460 nm preferably is 90% or more.

In the lead frame according to one aspect of the present invention, in the plating layers, the noble metal plating layer preferably further includes an Au plating layer arranged between the glossy Ni plating layer and the Ag plating layer.

In addition to prevention of the plating unevenness on the coating surface, this configuration contributes to preventing heat diffusion of Cu.

In the lead frame according to one aspect of the present invention, in the plating layers, the noble metal plating layer preferably further includes a Pd plating layer arranged between the glossy Ni plating layer and the Au plating layer.

In addition to prevention of the plating unevenness on the coating surface, this configuration contributes to preventing heat diffusion of Cu as well as allows the Au plating layer to be made thin, to reduce the amount of Au to be used, which is expensive.

Also, a resin-equipped lead frame according to one aspect of the present invention includes the above-described lead frame and a reflector resin portion formed on a periphery of the die pad portion on which an optical semiconductor element is to be mounted and the lead portion electrically connectable with the optical semiconductor element, to surround the surface laminated with the plating layers.

When the uppermost layer, or the Ag plating layer having the gloss of 1.6 or more is formed to have a coating thickness of 0.3 μm or more and 2.5 μm or less (i.e., in a range of 0.3 μm to 2.5 μm, inclusive), this configuration provides a resin-equipped lead frame which contributes to maintaining the gloss of 1.6 at the coating surface, prevents plating unevenness on the coating surface, and allows the coating thickness of noble metal to be thin, to achieve cost reduction.

Also, an optical semiconductor device according to one aspect of the present invention includes the above-described resin-equipped lead frame, an optical semiconductor element mounted on the die pad portion, a connecting member that electrically connects the optical semiconductor element and the lead portion, and a sealing resin portion formed of a transparent resin filling a spatial region that is surrounded by the reflector resin portion and that accommodates the optical semiconductor element and the connecting member.

When the uppermost layer, or the Ag plating layer having the gloss of 1.6 or more is formed to have a coating thickness of 0.3 μm or more and 2.5 μm or less, this configuration provides an optical semiconductor device which contributes to maintaining the gloss of 1.6 at the coating surface, prevents plating unevenness on the coating surface, and allows the coating thickness of noble metal to be thin, to achieve cost reduction.

Also, a method according to one aspect of the present invention for manufacturing a lead frame to be used in an optical semiconductor device includes a process of laminating a surface on a lead frame substrate with a glossy Ni plating layer having a gloss of 2.0 or more and 3.5 or less and a noble metal plating layer including an Ag plating layer that has a gloss of 1.6 or more and that is arranged as an uppermost layer, the surface being of at least a part of or an entirety of sites that correspond to a die pad portion on which an optical semiconductor element is to be mounted and a lead portion electrically connectable with the optical semiconductor element.

In the method according to one aspect of the present invention for manufacturing a lead frame, the Ag plating layer preferably is formed to have a thickness of 0.3 μm or more and 2.5 μm or less.

Forming the uppermost layer, or the Ag plating layer having the gloss of 1.6 or more to have a coating thickness in this range contributes to maintaining the gloss of 1.6 at the coating surface, prevents plating unevenness on the coating surface, and allows the coating thickness of noble metal to be thin, to achieve cost reduction.

In the method of one aspect of the present invention for manufacturing a lead frame, the Au plating layer preferably is formed to have a surface roughness in terms of Ra of 0.02 μm or more and 0.05 μm or less (i.e., in a range of 0.02 μm to 0.05 μm, inclusive).

This configuration provides a lead frame that makes it possible to prevent plating unevenness on the coating surface without being affected by the size of underlying crystal grains or lowering the gloss of the Ag plating layer.

In the method according to one aspect of the present invention for manufacturing a lead frame, the plating bath used in forming the glossy Ni plating layer preferably is a sulfamic acid bath to which a brightening agent containing sulfur is added, with a current density of 3 to 10 A/dm$^2$.

This configuration allows dense Ni grains to grow, to form a glossy Ni coating surface, which is laminated with a noble metal coating including, as an uppermost layer, an Ag plating layer, to thereby achieve a lead frame in which plating unevenness of the coating surface can be prevented.

In the method according to one aspect of the present invention, for manufacturing a lead frame, the die pad portion and the lead portion may be formed after the surface, on the lead frame substrate, of at least a part of or an entirety of the sites that correspond to the die pad portion and the lead portion is laminated with the glossy Ni plating layer having the gloss of 2.0 or more and 3.5 or less and the noble metal plating layer including the Ag plating layer, which has a gloss of 1.6 or more and is arranged as the uppermost layer.

Alternatively, in the method according to one aspect of the present invention for manufacturing a lead frame, the die pad portion and the lead portion may be formed before the surface, on the lead frame substrate, of at least a part of or an entirety of the die pad portion and the lead portion is laminated with the glossy Ni plating layer having the gloss of 2.0 or more and 3.5 or less and the noble metal plating layer including the Ag plating layer, which has a gloss of 1.6 or more and is arranged as the uppermost layer.

Hereinafter, preferred embodiment of the present invention will be described in detail with reference to the drawings. Note that the embodiment described below does not limit the contents of the present invention recited in the claims, and not all of the configurations described in the this embodiment are essential as measures for solving the present invention.

[Lead Frame, Resin-Equipped Lead Frame, Optical Semiconductor Device]

FIG. 1 is a cross-sectional view that schematically shows a configuration of a lead frame for an optical semiconductor device according to an embodiment of the present invention.

A lead frame 50 for an optical semiconductor device of the this embodiment is configured to include a die pad portion 30 and a lead portion 40 which are formed by etching a metal plate as a lead frame substrate.

The metal plate as a lead frame substrate is made of a common copper-based material and has a plate thickness of 0.1 mm to 0.3 mm.

The die pad portion 30 is a region for mounting an optical semiconductor element thereon. The lead portion 40 is a region that forms a terminal for electrically connecting an electrode of the optical semiconductor element mounted on the die pad portion 30.

Plating is applied to a surface on the optical-semiconductor-element-mounting side of the lead frame substrate forming at least one of the die pad portion 30 and the lead portion 40, to form at least one of a die pad portion surface plating layer 10 and a lead portion surface plating layer 20. In FIG. 1, for convenience, both of the die pad portion surface plating layer 10 and the lead portion surface plating layer 20 are shown.

These plating layers have the function of efficiently reflect, at the coating surface thereof, downward light emitted from the optical semiconductor element in the optical semiconductor device, in addition to the use for mounting the optical semiconductor element and for wire bonding.

Figure 2A:
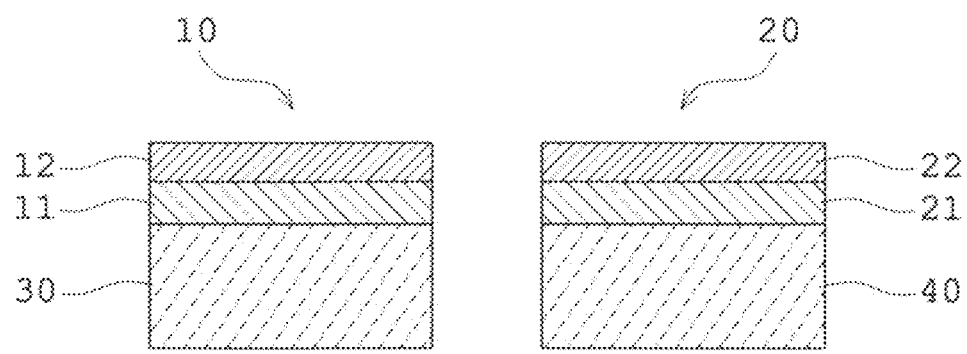
Figure 2B:
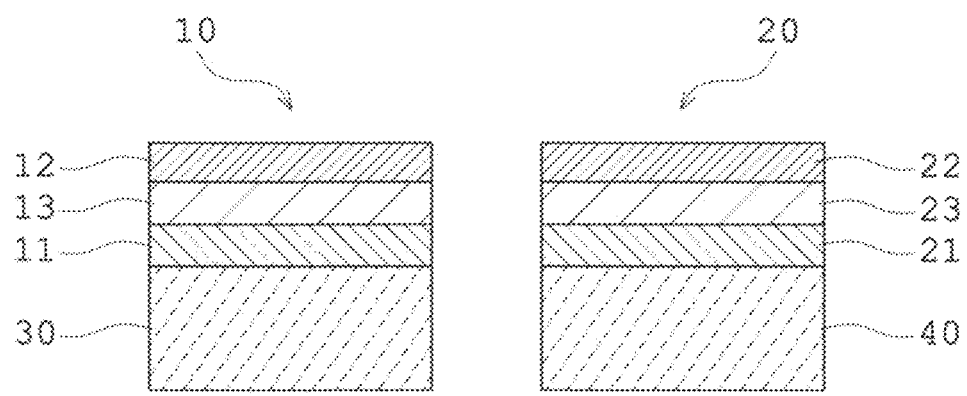

FIGS. 2A-2B are explanatory diagrams that schematically show the coating configuration of a lead frame for an optical semiconductor device according to the embodiment, in which FIG. 2A shows an example and FIG. 2B shows another example.

As shown in FIG. 2A, each of the die pad portion surface plating layer 10 and the lead portion surface plating layer 20 is configured of a glossy Ni plating layer 11(21) having a gloss of 2.0 or more and 3.5 or less and a noble metal plating layer including, as the outermost layer, an Ag plating layer 12(22) having a gloss of 1.6 or more and a coating thickness of 0.3 μm to 2.5 μm laminating a surface of at least one of the pad portion 30 and the lead portion 40, which are formed by processing the metal plate.

Alternatively, as shown in FIG. 2B, each of the die pad portion surface plating layer 10 and the lead portion surface plating layer 20 may be configured of a glossy Ni plating layer 11(21) having a gloss of 2.0 or more and 3.5 or less and a noble metal plating layer including an Au plating layer 13(23) and, as the outermost layer, an Ag plating layer 12(22) having a gloss of 1.6 or more and a coating thickness of 0.3 μm to 2.5 μm laminating, in order from the metal-plate-surface side, the surface of the pad portion 30 or the lead portion 40.

Alternatively, each of the die pad portion surface plating layer 10 and the lead portion surface plating layer 20 may be configured of a glossy Ni plating layer 11(21) having a gloss of 2.0 or more and 3.5 or less and a noble metal plating layer including a Pd plating layer, an Au plating layer and, as the outermost layer, an Ag plating layer having a gloss of 1.6 or more and a coating thickness of 0.3 μm to 2.5 μm laminating, in order from the metal-plate-surface side, the surface of the pad portion 30 or the lead portion 40.

The details of the structure, mechanism etc. of the die pad portion surface plating layer 10 and the lead portion surface plating layer 20 in the lead frame of the this embodiment will be described later.

Figure 3:
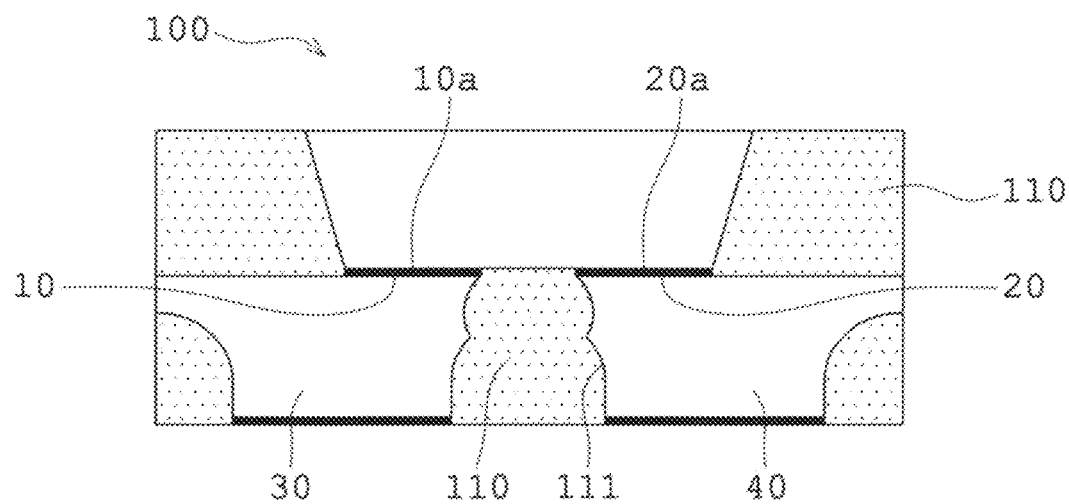
FIG. 3 is a cross-sectional view that schematically show a configuration of a resin-equipped lead frame according to an embodiment of the present invention.

FIG. 3 is a cross-sectional view that schematically show a configuration of a resin-equipped lead frame according to one embodiment of the present invention.

The resin-equipped lead frame of the embodiment includes, as shown in FIG. 3, the lead frame of the embodiment shown in FIG. 1 and a reflector resin portion 110.

The reflector resin portion 110 is formed on the front side of the die pad portion 30 and the lead portion 40 so as to surround an optical semiconductor element mounting portion 10a on the die pad portion 30 and a connection portion 20 for a bonding wire on the lead portion 40 in the lead frame.

The reflector resin portion 110 is formed also in a gap portion 111 between the die pad portion 30 and the lead portion 40 disposed opposite to each other, by filling the space with reflector resin.

The reflector resin portion 110 serves to reflect, toward upside, light emitted from the optical semiconductor element and travelling sideward and downward.

Figure 4:
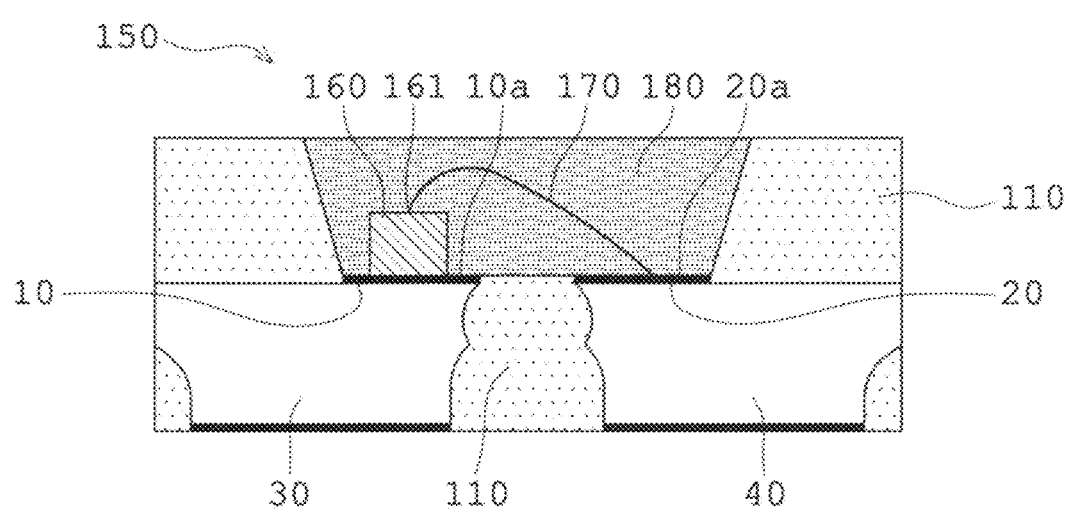
FIG. 4 is a cross-sectional view that schematically shows a configuration of an optical semiconductor device according to an embodiment of the present invention.

FIG. 4 is a cross-sectional view that schematically shows a configuration of one example of an optical semiconductor device according to one embodiment of the present invention.

The optical semiconductor device 150 of this embodiment is configured upon use of the resin-equipped lead frame 100 shown in FIG. 3.

Specifically, an optical semiconductor element 160 is mounted on the optical semiconductor element mounting portion 10a on the upper surface of the plating layer 10 formed on the surface of the die pad portion 30 in the resin-equipped lead frame 100.

An electrode 161 of the optical semiconductor element 160 and the connection portion 20a for a bonding wire or the like on the upper surface of the plating layer 20 formed on the surface of the lead portion 40 are electrically connected via a bonding wire 170 or the like.

A region accommodating the optical semiconductor element 160 and the bonding wire 170 and surrounded by the reflector resin portion 110 is filled with transparent resin, to form a sealing resin portion 180.

As described above, the lead frame 50 of this embodiment for an optical semiconductor device is characterized in having the plating layer 10, 20 configured of the glossy Ni plating layer 11, 21 with a gloss of 2.0 or more and 3.5 or less and a noble metal plating layer including the Ag plating layer 12, 22, as an uppermost layer, with a coating thickness of 0.3 μm to 2.5 μm and a gloss of 1.6 or more, to laminate a surface on the lead frame substrate (metal plate) forming at least a part of or an entirety of the die pad portion 30 on which the optical semiconductor element 160 is mounted and the lead portion 40 electrically connectable with the optical semiconductor element 160.

Configuring the die pad portion surface plating layer 10 and the lead portion surface plating layer 20 as in the lead frame 50 of this embodiment for an optical semiconductor device contributes to maintaining the gloss of 1.6 at the coating surface, prevents plating unevenness on the coating surface, and allows the coating thickness of noble metal to be thin, to achieve cost reduction.

Here, why the configuration of the plating layer in the lead frame of this embodiment makes it possible to prevent plating unevenness and to reduce coating thickness of noble metal will be described in detail.

First, the mechanism of uneven plating occurrence will be described with reference to FIGS. 5A-5D.

Figure 5A:
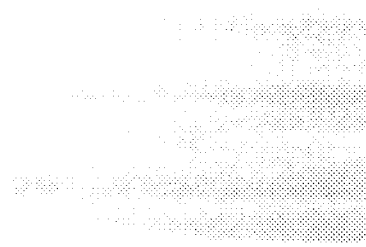
FIGS. 5A-5D are respective images of plating layers, in a normal portion where no unevenness of plating occurs and in an unevenly plated portion where unevenness of plating occurs, made to laminate a metal plate as a lead frame substrate in accordance with the conventional art.
Figure 5B:
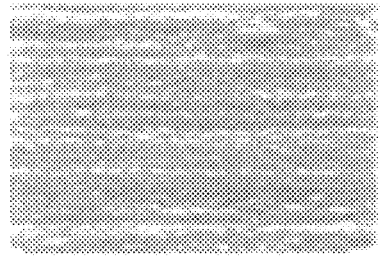
Figure 5C:
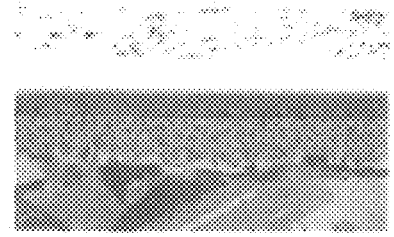
Figure 5D:
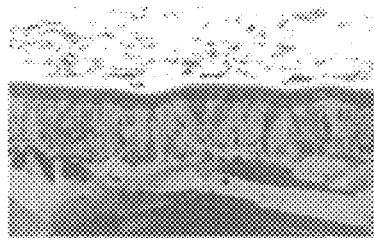

FIGS. 5A-5D are respective images of plating layers, in a normal portion where no unevenness of plating occurs and in an unevenly plated portion where unevenness of plating occurs, made to laminate a metal plate as a lead frame substrate in accordance with the conventional art; FIG. 5A is an image showing a state of a surface of an Ag plating layer in the normal portion, FIG. 5B is an image showing a state of a surface of the Ag plating layer in the unevenly plated portion, FIG. 5C is a scanning ion microscopic image showing a state of a cross section of the plating layers in the normal portion, and FIG. 5D is a scanning ion microscopic image showing a state of a cross section of the plating layers in the unevenly plated portion.

As shown in FIG. 5A, the surface of the Ag plating layer is substantially smooth in the normal portion where no plating unevenness occurs.

In contrast, as shown in FIG. 5B, the surface of the Ag plating layer is rough with irregularities in the unevenly plated portion where uneven plating has occurred. These irregularities are so minute as to be only recognizable under the imaging magnification of 5000 times.

Here, the present inventor observed a crystalline state of a cross section of the plating layers in each of the normal portion and the unevenly plated portion using a scanning ion microscope.

As shown in FIG. 5C, the upper surface of the Ag plating layer was recognized to be substantially flat in the normal portion where no plating unevenness occurred.

In contrast, as shown in FIG. 5D, the upper surface of the Ag plating layer was recognized to cave in the unevenly plated portion where plating unevenness occurred.

Further, comparing FIG. 5C and FIG. 5D, the present inventor found in the unevenly plated portion shown in FIG. 5D that the Ni plating layer and the Cu substrate had large crystal grains particularly at a region where the upper surface of the Ag plating layer caves.

The crystal size of a coating is controllable by the plating conditions. If the plating conditions are equal, however, the crystal size of the plating layer tends to correlate with the size of the crystal grains in the base. In the case of the plating layers shown in FIGS. 5A-5D, the crystal size of the Ag plating layer is considered to be affected by the crystalline state of the Ni plating layer as a base plating layer for the Ag plating layer and the metal plate as a lead frame substrate.

A plating layer grows in correlation with the size of crystal grains at a surface of a metal plate. When crystal grains at the surface of the metal plate are fine, dense crystals of the coating grows, and when crystal grains at the surface of the metal plate are large, crystals of the coating also coarsens.

Since metal crystals grow such that individual crystals are kept substantially equal in crystalline volume, coarsened metal crystals have a lower height.

Accordingly, a portion where crystal grains are coarser than a portion where crystal grains are fine has a caved-in shape in reference to the neighboring portion where crystal grains are fine.

This caved-in shape comes to be irregularities on the coating surface, which involve a larger difference in brightness than in a smooth normal portion, and this difference in brightness may be judged, on the basis of appearance, to be plating unevenness.

As a result of intensive investigations, the present inventor has found out that configuring a lead frame to have a surface on a lead frame substrate forming at least a part of or an entirety of a die pad portion 30 and a lead portion 40 laminated with a glossy Ni plating layer with a gloss of 2.0 or more and 3.5 or less and a noble metal plating layer including an Ag plating layer, as an uppermost layer, with a coating thickness of 0.3 μm to 2.5 μm and a gloss of 1.6 or more should contribute to maintaining the gloss of 1.6 at the coating surface, prevent plating unevenness on the coating surface, and allow the coating thickness of noble metal to be thin, to achieve cost reduction.

As described above, the plating layers in the lead frame 50 of the this embodiment are configured to include a noble metal plating layer including an Ag plating layer 12, 22, as an uppermost layer, having a gloss of 1.6 or more, and a glossy Ni plating layer 11, 21, as a base layer, having a gloss of 2.0 or more and 3.5 or less.

In the lead frame 50 of the this embodiment, the plating layers on the optical-semiconductor-element-mounting side of the lead frame are made to efficiently reflect, at the coating surface, downward light emitted from the optical semiconductor element by the configuration in which the outermost Ag plating layer 12, 22 has a gloss of 1.6 or more and a coating thickness of 0.3 μm or more and 2.5 μm or less. In this situation, providing an Ag plating layer having a gloss of 1.6 or more is not sufficient for maintaining a high gloss of 2.0 or higher particularly at the Ag coating surface; the quality of the base plating layer forming a base for the Ag plating layer also is important.

A gloss referred to in this specification is a value of gloss obtained by measurement using a micro color meter VSR400 manufactured by Nippon Denshoku Co., Ltd under the conditions with the collimator diameter of 0.05 mmφ and the light source angle of 45°.

In conventional lead frames, base plating layers have been formed of Ni plating layers. As described above, a Ni plating layer basically forms dense and fine crystal grains, but is easily affected by the size of crystal grains at the surface of a metal plate as a lead frame substrate located underneath.

Therefore, in the lead frame 50 of this embodiment, a glossy Ni plating layer 11, 21 having a gloss of 2.0 or more and 3.5 or less, which is achieved by addition of a brightening agent containing sulfur to Ni plating solution, is formed on the surface of the metal plate as a lead frame substrate.

A glossy Ni coating having a gloss of 2.0 or more and 3.5 or less obtained by addition of a brightener has finer crystal grains than a normal Ni coating obtained without use of a brightener. Therefore, even at a site where a crystal grain diameter of the metal plate is large, the glossy Ni plating layer has a small crystal grain diameter, and thus these fine crystals grow to form a layer, to achieve a specular flatness at the glossy Ni coating surface.

Further, since the glossy Ni plating layer has a uniform, small crystal grain diameter, the Ag plating layer formed on the glossy Ni plating layer is a plating layer having a uniform crystal grain diameter.

As a result, occurrence of plating unevenness at the coating surface can be prevented.

It is generally discussed that crystal growth in Ni plating is epitaxially proceeds in conformance with Cu crystals at the metal plate surface. Epitaxial growth in a case where an Ag plating layer is further formed on a Ni plating layer is called heteroepitaxial with different crystals of Cu, Ni and Ag.

There has been indicated a situation where transition from layer growth to island growth occurs in heteroepitaxial growth.

Crystal growth at a surface where crystal lattices are well matched is referred to as Frank van der Merwe growth mode, which is layer growth. On the other hand, crystal growth in the state of crystal lattice mismatch is called Volmer Weber growth mode and is island growth.

It can be said that this is a phenomenon in which crystals for a coating, at a site where island growth has locally occurred owing to presence or absence of a work-affected layer, a difference in crystal growth direction or the like at the surface of the metal plate, finally appear to be caved at the coating surface. The unevenly plated portion in FIGS. 5B and 5D indicates this caved surface state.

The glossy Ni plating layer 11, 21 used for the lead frame 50 of this embodiment has a structure achieved by the technique of making island growth dominant in the Ni plating crystal growth process by adding a brightening agent containing sulfur to the Ni plating solution, for inhibiting, in the growth of the Ni coating, layer growth through causing island growth to occur uniformly over the entire region. Crystal growth of the Ag coating laminating this layer structure of the Ni plating layer is uniformed, moderating the difference caused by mixture of layer growth and island growth, to achieve uniformity of the finally formed surface. Inhibition of layer growth eventually inhibits caving of the surface caused by island growth intervening in layer growth.

Figure 6:
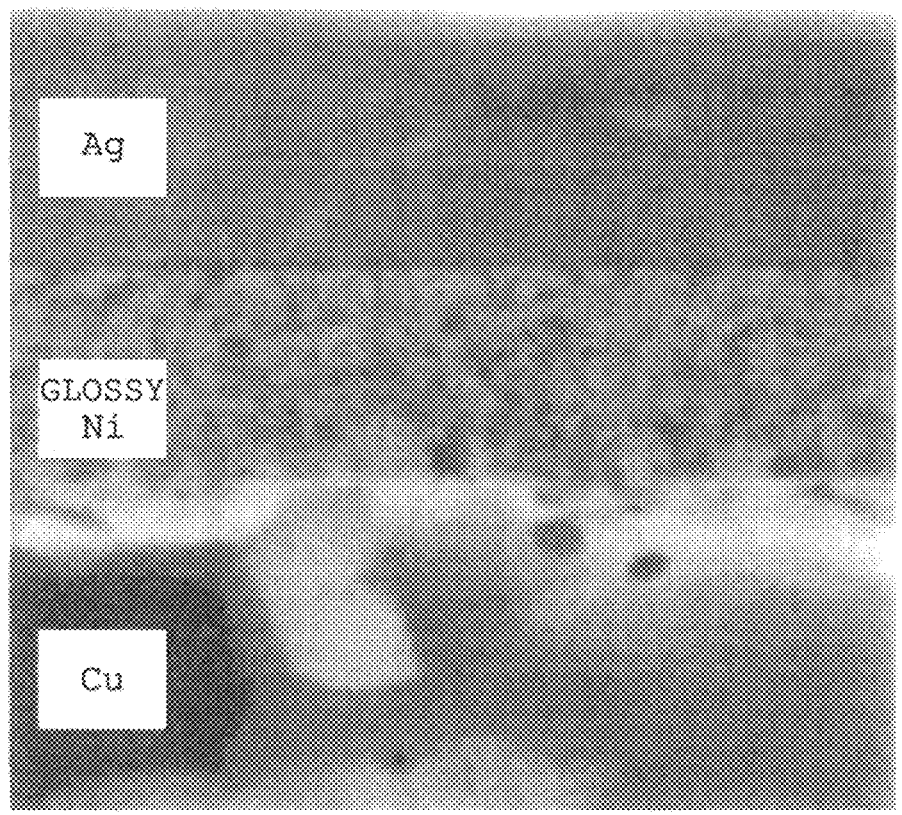
FIG. 6 is a scanning ion microscopic image showing a state of a cross section of plating layers in a lead frame for an optical semiconductor device according to an embodiment of the present invention.

FIG. 6 is a scanning ion microscopic image showing a state of a cross section of plating layers in a lead frame for an optical semiconductor device of this embodiment. As shown in FIG. 6, large Cu crystals are formed at the surface of the metal plate, on which a glossy Ni plating layer is formed. The glossy Ni plating layer is uniformly composed of fine crystal grains without any large Ni crystals. Further, no caving occurs at the upper surface of the Ag plating layer, either.

The mechanism of preventing plating unevenness will be described using a model diagram.

Figure 7A:
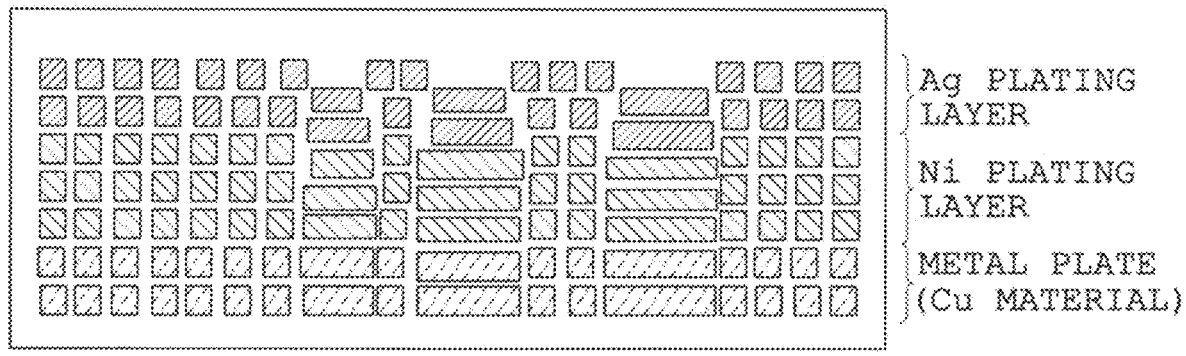
FIGS. 7A-7B are explanatory diagrams that schematically show crystal grains in plating layers, at an unevenly plated portion where unevenness of plating occurs in plating layers formed in accordance with the prior art, and at a normal portion where no unevenness of plating occurs in plating layers formed in a lead frame for an optical semiconductor device according to one embodiment of the present invention, respectively.
Figure 7B:
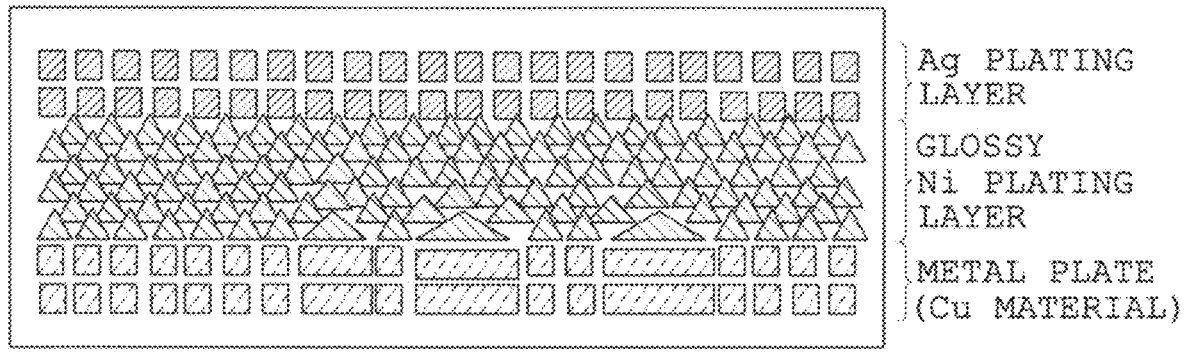

FIGS. 7A-7B are explanatory diagrams that schematically show crystal grains in plating layers, at an unevenly plated portion where unevenness of plating occurs in plating layers formed in accordance with the prior art, and at a normal portion where no unevenness of plating occurs in plating layers formed in a lead frame for an optical semiconductor device according to this embodiment, respectively; FIG. 7A is a diagram that shows crystal grains at the unevenly plated portion in the plating layers according to the prior art, and FIG. 7B is a diagram that shows crystal grains at the normal portion in the plating layers according to the lead frame of the embodiment.

In the plating layers formed by the prior art, as shown in FIG. 7A, Ni grains on a metal plate grow under the influence of the crystal grain diameter of the metal plate, and in turn affect an Ag plating layer formed thereon. As a result, the Ag coating surface is caved to cause plating unevenness.

On the other hand, in the lead frame 50 of this embodiment, as shown in FIG. 7B, by forming a glossy Ni plating layer with uniform and fine crystal grains, the crystals of glossy Ni grow while keeping differences in size between individual grains to be small without being affected by crystal grain diameters of the metal plate, and allow the Ag coating surface formed thereon to be a smooth coating surface without a cave-in, thereby preventing plating unevenness.

Further, forming a glossy Ni plating layer makes it dispensable to perform, after formation of the Ni plating layer, roughening treatment by etching for enhancing the gloss, thereby improving the manufacturing efficiency.

Further, the surface roughness in terms of Ra of the glossy Ni plating layer 11, 21 in the lead frame 50 of this embodiment is in the range of 0.02 μm or more and 0.05 μm or less.

If the glossy Ni plating layer 11, 21 has a surface roughness in terms of Ra below 0.02 μm, it is easily affected by the crystal grain size of the base, and occurrence of plating unevenness cannot be prevented.

On the other hand, if the surface roughness in terms of Ra of the glossy Ni plating layer 11, 21 exceeds 0.05 μm, fine irregularities are formed over the entirety of the glossy Ni coating surface, to lower the gloss of the Ag plating layer formed thereon, and finally the reflectance for light also.

The surface roughness in terms of Ra of the glossy Ni plating layer 11, 21 in the lead frame 50 of this embodiment preferably is in the range of 0.03 μm or more and 0.04 μm or less.

The surface roughness referred to in this specification is a centerline average roughness, and has a value measured by, for example, a scanning confocal laser microscope LEXT OLS3000 manufactured by Olympus Corporation.

The gloss of the glossy Ni plating layer 11, 21 in the lead frame 50 of this embodiment is in the range of 2.0 or more and 3.5 or less.

The glossy Ni plating layer is formed upon use of a sulfamic acid-based plating solution to which a brightening agent such as that containing sulfur is added.

If the gloss of the glossy Ni plating layer falls below 2.0, the gloss of the outermost Ag plating layer is affected, to fail to achieve a predetermined glossiness.

On the other hand, if the gloss exceeds 3.5, an excess of a brightening agent in the Ni plating solution is required, resulting in economic waste.

The gloss of the glossy Ni plating layer 11, 21 in the lead frame 50 of the this embodiment preferably is in the range of 2.5 or more and 3.0 or less.

The coating thickness of the glossy Ni plating layer 11, 21 in the lead frame 50 of the this embodiment is 0.5 μm or more and 3.0 μm or less.

If the glossy Ni plating layer 11, 21 has a coating thickness below 0.5 μm, it fails serve as the base plating layer, lowers the gloss of the Ag plating layer formed thereon, and cannot maintain to be preventive of sulfide corrosion of the Ag plating layer.

On the other hand, if the coating thickness of the glossy Ni plating layer 11, 21 exceeds 3.0 μm, the production time for the plating layer comes to be long, to lower the productivity. In addition, plating stress is likely to be generated, to cause warpage or detachment of the coating.

The coating thickness of the glossy Ni plating layer 11, 21 in the lead frame 50 of the this embodiment preferably is around 2.0 μm.

Further, an Ag plating layer 12, 22 having a gloss of 1.6 or more is formed on the upper side of the glossy Ni plating layer 11, 21 in the lead frame 50 of the this embodiment. The coating thickness of the Ag plating layer 12, 22 preferably is 0.3 μm or more and 2.5 μm or less.

If the coating thickness of the Ag plating layer exceeds 2.5 μm, the amount of Ag to be used increases, to raise the cost, and the production time for the plating layer comes to be long, to lower the productivity.

On the other hand, if the coating thickness of the Ag plating layer falls below 0.3 μm, the wire bondability may not be obtained.

The coating thickness of the Ag plating layer 12, 22 in the lead frame 50 of the this embodiment preferably is around 1.0 μm.

Further, the surface roughness in terms of Ra of the Ag plating layer 12, 22 in the lead frame 50 of the this embodiment is 0.02 μm or more and 0.05 μm or less.

Since the Ag plating layer inherits the surface roughness from the glossy Ni plating layer as the base, the surface roughness of the Ag plating layer has a value equivalent to that of the surface roughness of the glossy Ni plating layer. With the surface roughness being in such a range, the surface of the Ag plating layer can have a reflectance of 90% or more for 460 nm.

The crystalline orientation of the glossy Ni plating layer 11, 21 in the lead frame 50 of the this embodiment is such that the surface index (111) is dominant over the surface index (200).

Further, in the lead frame 50 of the this embodiment, another noble metal plating layer may be formed between the glossy Ni plating layer 11, 21 and the Ag plating layer 12, 22, or the uppermost layer. For example, an Au plating layer 13, 23 may be formed. The addition of the Au plating layer is effective in preventing heat diffusion to the outermost surface of Cu, which is a metal material used for the lead frame substrate. The thickness of the Au plating layer 13, 23 is 0.001 μm or more and 0.01 μm or less.

If the Au plating layer has a coating thickness below 0.001 μm, it cannot serve to prevent thermal diffusion of the base Cu.

On the other hand, if the thickness of the Au plating layer exceeds 0.01 μm, the production time for the plating layer comes to be long, to lower the productivity. In addition, a large amount of expensive Au is to be used, to raise the production cost.

The thickness of the Au plating layer 13, 23 in the lead frame 50 of the this embodiment preferably is around 0.005 μm.

In the lead frame 50 of the this embodiment, a Pd plating layer and an Au plating layer may be formed between the glossy Ni plating layer 11, 21 and the Ag plating layer 12, 22, or the uppermost layer.

The Pd plating layer serves to prevent heat diffusion of the base Cu as well as allows the Au plating layer to be made thin, to save the amount of expensive Au to be used.

In this configuration, it is necessary to make the Pd plating layer to have such a coating thickness as allows uniformity and fineness of crystal grains in the glossy Ni plating layer, which is the base plating layer, to be inherited as they are.

The thickness of the Pd plating layer is 0.01 μm or more and 0.1 μm or less.

If the Pd plating layer has a thickness below 0.01 μm, it cannot serve to prevent heat diffusion of the base Cu.

On the other hand, if the thickness of the Pd plating layer exceeds 0.1 μm, the production time for the plating layer comes to be long, to lower the productivity. In addition, a large amount of expensive Pd is to be used, to raise the production cost.

The thickness of the Pd plating layer in the lead frame 50 of the this embodiment preferably is around 0.03 μm.

Further, by using the lead frame 50 of the this embodiment, it is possible to manufacture a resin-equipped lead frame 100 for an optical semiconductor device and a semiconductor device 150 using the same.

According to the semiconductor device 150 of the this embodiment, in the lead frame 50, since the glossy Ni plating layer 11, 21 reduces unevenness (fine cave-ins in the surface) generated in the reflective layer at the surface of the outermost Ag plating layer 12, 22, the reflectance can be stabilized.

Further, according to the resin-equipped lead frame 100 and the semiconductor device 150 of the this embodiment, the inspection yield for appearance of the Ag plating layer 12, 22 can be greatly improved.

Also, the coating thickness of Ag set to be small leads to a small coating thickness of noble metals and to cost reduction.

[Method for Manufacturing Lead Frame]

Next, a method for manufacturing a lead frame according to one embodiment of the present invention will be described. The method for manufacturing a lead frame is roughly classified into two types; the post-plating method in which a lead frame having a preliminarily formed predetermined pattern undergoes etching treatment, and the pre-plating method in which, before a predetermined pattern is formed, a metal plate surface preliminarily undergoes etching treatment at necessary sites, or the corresponding sites at which a die pad portion and a lead portion will be formed, and then the predetermined pattern is formed via use of a resist layer or the like, to fabricate a lead frame.

The term "corresponding site" in the present specification includes both the site where a die pad portion or a lead portion is to be manufactured and the site where it has already been formed.

Hereinafter, a method for manufacturing a lead frame using the pre-plating method will be described.

FIGS. 8A-8G are explanatory diagrams that schematically show a series of steps in a method according to one embodiment of the present invention for manufacturing a lead frame.

Figure 8A:
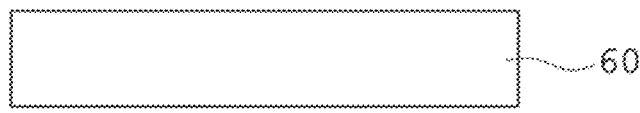
FIGS. 8A-8G are explanatory diagrams that schematically show a series of steps in a method according to an embodiment of the present invention for manufacturing a lead frame.
Figure 8B:

In manufacturing a lead frame for mounting an optical semiconductor element thereon according to the this embodiment, first, a metal plate 60 as a lead frame substrate is prepared (see FIG. 8A).

The material of the metal plate 60 to be used is not particularly limited as long as it is a lead frame substrate, but a Cu alloy or Cu is generally used.

Then, a photoresist (for example, dry film resist) is made to laminate the front and back surfaces of the metal plate 60 to provide a photoresist layer, which is covered with a glass mask carrying a plating pattern and then is exposed to transfer the pattern to the resist, and then is developed. Thereby, a resist mask 70 for plating is formed (see FIG. 8B).

Figure 8C:
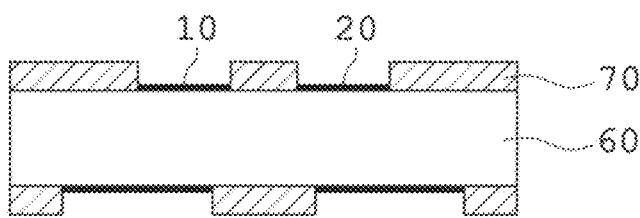

Then, for forming the die pad portion surface plating layer 10 and the lead portion surface plating layer 20, a glossy Ni plating layer 11, 21 and an Ag plating layer 12, 22 as shown in FIG. 2A or a glossy Ni plating layer 11, 21, an Au plating layer 13, 23 and an Ag plating layer 12, 22 as shown in FIG. 2B are formed in the openings in the resist mask 70 for plating by electrolytic plating (See FIG. 8C). Alternatively, as the die pad portion surface plating layer 10 and the lead portion surface plating layer 20, a glossy Ni plating layer, a Pd plating layer, an Au plating layer and an Ag plating layer may be formed in this order.

The plating solution used for the glossy Ni plating is a sulfamic acid-based plating solution to which a brightener containing sulfur is added. The current density is 3 to 10 $A/dm^2$ so that crystals grow into uniform and fine crystal grains. The gloss is adjusted to take a predetermined value via appropriate control of current density, conveyance speed etc. In this way, as shown in FIG. 6 and FIG. 7B, Ni crystals are made to grow into uniform and fine crystal grains, to form a smooth surface of the glossy Ni plating layer. Moreover, the center line average roughness Ra at the surface of the glossy Ni plating layer can be 0.02 μm or more and 0.05 μm or less. This configuration makes it possible to prevent plating unevenness on the coating surface without being affected by the size of underlying crystal grains or lowering the gloss of the Ag plating layer.

The coating thickness of the Ag plating layer is adjusted to be 0.3 μm or more and 2.5 μm or less. Since the Ag plating layer inherits the finished state of the underlying glossy Ni coating having a gloss of 2.0 or more and 3.5 or less, it is possible to secure the gloss at the uppermost surface of the Ag plating layer to be as high as about 1.6 to 2.6.

In the case of an Ag plating layer formed on a normal Ni plating layer, it is necessary, in general, to set the Ag coating thickness to 2.5 μm or more for preventing the influence of the underlying base.

In contrast, in the lead frame of the this embodiment, since uniform and fine crystal grains are formed in the glossy Ni coating, any Ag coating thickness as allows the surface state of the underlying base to be inherited is sufficient. Therefore, an Ag coating thickness of 0.3 μm or more and 2.5 µm or less, which is designed only in consideration of the wire bondability to the surface of the Ag plating layer, is feasible, and thus a significant cost reduction can be achieved by reduction in amount of Ag to be used.

Figure 8D:

Then, the resist mask 70 for plating formed on both surfaces of the metal plate is peeled off with a sodium hydroxide aqueous solution (see FIG. 8D).

Figure 8E:
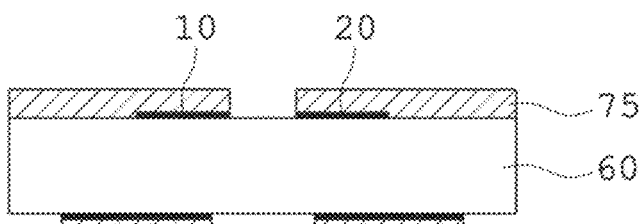

Then, a photoresist is made to laminate the metal plate 60 again, and a lead frame pattern of the die pad portion and the lead portion carried by a glass mask is transferred to the resist by photolithography process and developed, thereby a resist mask 75 for etching is formed (See FIG. 8E).

Figure 8F:
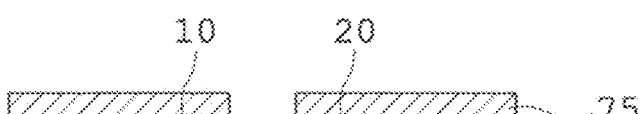

Then, unwanted metal portion is removed by etching upon use of a ferric chloride solution or the like so that a lead frame shape of the die pad portion 30 and the lead portion 40 emerges (see FIG. 8F).

Figure 8G:
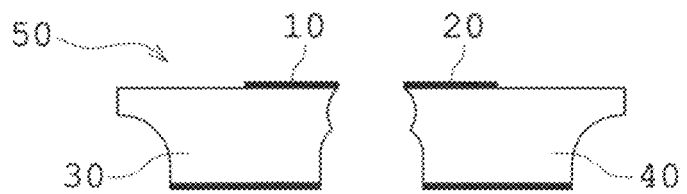

Then, the resist mask 75 for etching formed on both sides of the metal plate is peeled off with a sodium hydroxide aqueous solution (see FIG. 8G).

Thereby, a lead frame of this embodiment is completed in which the die pad portion surface plating layer 10 and the lead portion surface plating layer 20 are formed by laminating a part of the die pad portion and the lead portion with a glossy Ni plating layer and an Ag plating layer, with a glossy Ni plating layer, an Au plating layer and an Ag plating layer, or with a glossy Ni plating layer, a Pd plating layer, an Au plating layer and an Ag plating layer.

In the case where the lead frame of the this embodiment is manufactured by the post-plating method, at first, the lead frame pattern of the die pad portion and the lead portion shown in FIGS. 8E to 8G is shaped by etching. Then, plating shown in FIG. 8C is performed.

In the case of partial plating, portions other than the sites to be plated are covered with a mechanical mask such as a rubber mask, a cover film, a resist or the like, and then the plating layers 10 and 20 are formed by the same plating technique as described for the method for manufacturing a lead frame using the pre-plating method.

If the entire surface is to be plated, plating is performed after shaping the lead frame pattern without using a resist mask 70 for plating described for the method for manufacturing a lead frame using the pre-plating method.

It is sufficient to reserve, for the coating configuration in the lead frame of this embodiment, at least the regions that are in contact with the transparent resin portion on the semiconductor-element-mounting side. Therefore, plating layers to be an external terminal portion on the back surface side of the lead frame may have the same coating configuration or a different coating configuration. However, the same coating configuration on the front side and back side can be simultaneously formed by plating, which is advantageous in productivity and cost. Further, formation of a predetermined lead frame pattern may be performed by a pressing method instead of the etching method.

[Method for Manufacturing Resin-Equipped Lead Frame]

Next, a method for manufacturing a resin-equipped lead frame according to one embodiment of the present invention will be described.

Figure 9A:
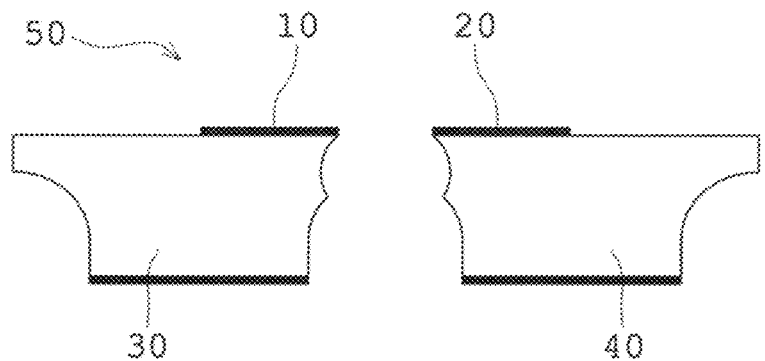
FIGS. 9A-9B are explanatory diagrams that schematically show a series of steps for manufacturing a resin-equipped lead frame according to an embodiment of the present invention.
Figure 9B:
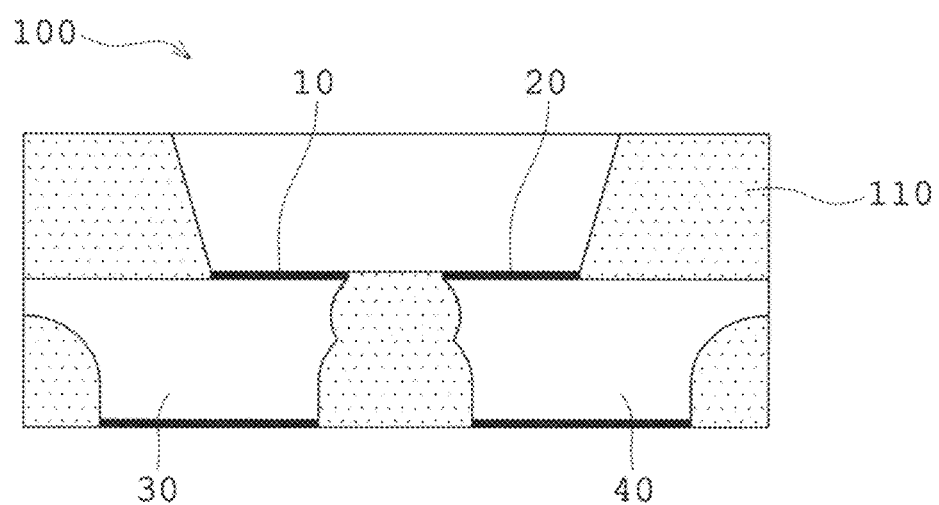

FIGS. 9A-9B are explanatory diagrams that schematically show a series of steps for manufacturing a resin-equipped lead frame according to one embodiment of the present invention.

In the process for manufacturing a resin-equipped lead frame of this embodiment, the lead frame 50 is prepared (see FIG. 9A).

Then, a reflector resin portion 110 is formed by transfer molding or injection molding on the lead frame 50 (see FIG. 9B). A thermoplastic resin is generally used as the reflector resin. The reflector resin portion 110 is formed around the periphery of the die pad portion 30 and the lead portion 40 on the lead frame 50, as surrounding an optical semiconductor element 160 and a connection portion electrically connectable with the lead portion 40 via a wiring bonding portion 170, which will be described later, as well as is formed in a gap portion between the die pad portion 30 and the lead portion 40 disposed opposite to each other, by filling the space with reflector resin. The inside face in the reflector resin portion 110 surrounding the periphery of the die pad portion 30 and the lead portion 40 is shaped to taper down the space so that the reflector resin portion 110 reflects upwardly light emitted from the optical semiconductor element 160 and travelling sideward.

Thereby, the resin-equipped lead frame 100 of the this embodiment is completed.

[Method for Manufacturing Optical Semiconductor Device]

Next, a method for manufacturing an optical semiconductor device according to one embodiment of the present invention will be described.

Figure 10A:
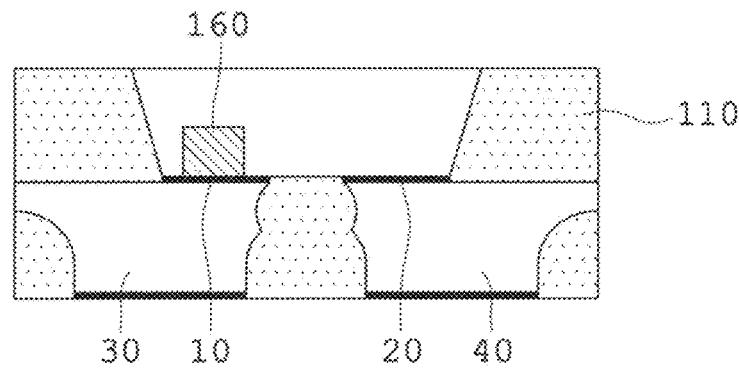
FIGS. 10A-10D are explanatory diagrams that schematically show a series of steps in a method for manufacturing an optical semiconductor device according to an embodiment of the present invention.
Figure 10B:
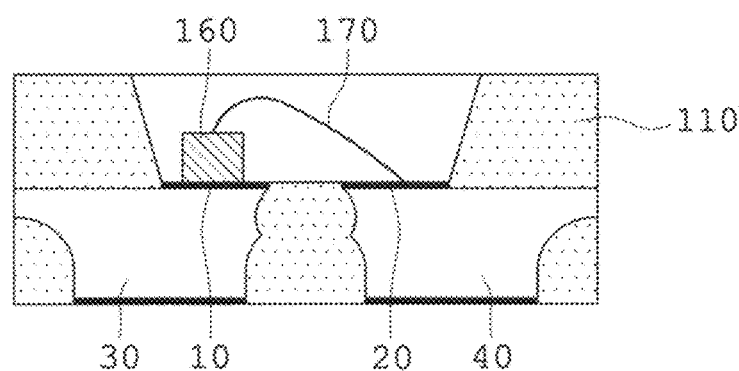

FIGS. 10A-10B are explanatory diagrams that schematically show a series of steps in a method for manufacturing an optical semiconductor device according to one embodiment of the present invention.

First, the resin-equipped lead frame 100 obtained through the process shown in FIG. 9 is prepared, and an optical semiconductor element 160 is mounted on the die pad portion surface plating layer 10 (see FIG. 10A). To be specific, an Ag paste or the like is preliminarily applied to the surface of the die pad portion surface plating layer 10, and the optical semiconductor element 160 is fixed on the die pad portion surface plating layer 10.

Then, an electrode of the optical semiconductor element 160 and the lead portion surface plating layer 20 are electrically connected by a connection method such as wire bonding using a connecting member such as a bonding wire 170 (see FIG. 10B).

Figure 10C:
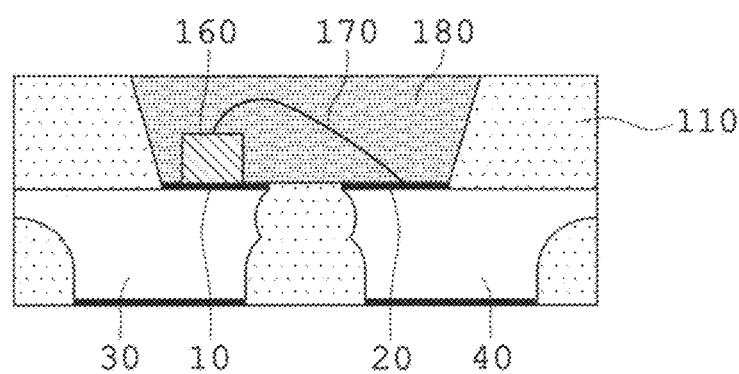
Figure 10D:
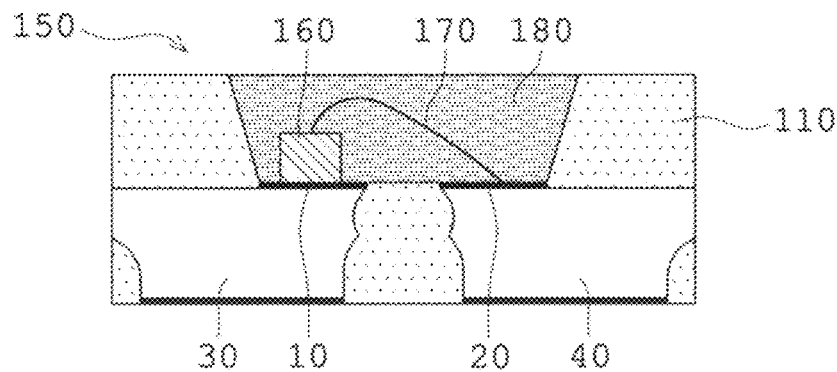

Then, a region accommodating the optical semiconductor element 160 and the connection portion electrically connected with the lead portion surface plating layer 20 via the bonding wire 170 and surrounded by the reflector resin portion 110 is filled with transparent resin, to form a sealing resin portion 180 (See FIG. 10C) Then, the product is trimmed into individual pieces having a predetermined package size (see FIG. 10D). In the case where resin-sealing is performed in bulk for a plurality of unit products, trimming is made by dicing or the like. In the case where product units are individually resin-sealed, trimming is made by punching-out using a press or the like.

Thereby, the optical semiconductor device 150 of the this embodiment is completed.

EMBODIED EXAMPLES

Next, a lead frame, a resin-equipped lead frame, and an optical semiconductor device according to one embodiment of the present invention will be described in detail in reference to Embodied Examples. It is noted that the present invention is not limited to these Embodied Examples.

Embodied Example 1

A lead frame for an optical semiconductor device of Embodied Example 1 was fabricated by means of post-plating method in which, after formation of a lead frame pattern, full plating was performed over the entire surface of the pattern.

To be specific, first, as a metal plate for forming a lead frame, a Cu plate having a thickness of 0.2 mm was processed into a long plate having a width of 140 mm, and then a photosensitive dry film resist having a thickness of 0.05 mm was applied to the both sides of the metal plate with a laminating roll.

Then, the dry film resist, on the front and back sides, was covered with a glass mask that carried a predetermined pattern for forming a die pad portion and a lead portion and was exposed to ultraviolet light. Thereafter, using a sodium carbonate solution, development treatment was performed to dissolve uncured dry film resist that failed to be irradiated with ultraviolet light and was left unaffected.

Then, exposed faces of the metal plate at openings from which the resist layer had been removed were etched. A ferric chloride solution was used as an etching solution. Then, the dry film resist was peeled off with a sodium hydroxide solution. Thereby, the shapes of the die pad portion and the lead portion were formed.

Then, the entire surface was plated without use of a mask for plating or the like. First, a glossy Ni coating was applied. The glossy Ni plating was performed at a current density of 5 A/dm$^2$ using a sulfamic acid-based plating solution to which an appropriate amount of a brightening agent containing sulfur was added. The plating conditions were appropriately adjusted so that, with the glossy Ni plating layer having the thickness of 2.0 μm and the surface roughness in terms of Ra of 0.04 μm, the gloss at the glossy Ni coating surface was 3.0. Thereafter, an Ag coating was applied. Ag plating was performed at a current density of 7 A/dm$^2$ using a cyan-based Ag plating solution. The plating solution conditions were appropriately adjusted so that the thickness of the Ag plating layer was 1.0 μm and the gloss at the Ag coating surface was 2.0. Thereafter, a lead frame of Embodied Example 1 was completed as cut into a piece of predetermined size.

Next, a reflector resin portion was formed on the fabricated lead frame. The reflector resin portion was formed to surround an optical semiconductor element and a connection portion electrically connected with the lead portion via wire bonding or the like. Also, a gap portion between the die pad portion 30 and the lead portion 40 disposed opposite to each other was filled with the reflector resin. Thereby, a resin-equipped lead frame of Embodied Example 1 was completed.

Next, upon Ag paste or the like being preliminarily applied to the surface of the die pad portion of the manufactured resin-equipped lead frame, an optical semiconductor element was mounted on the die pad portion. Then, an electrode of the optical semiconductor element and the lead portion were connected via wire bonding. Then, an opening surrounded by the reflector resin portion and accommodating the optical semiconductor element and the wire bonding portion was filled with a transparent resin, to form a sealing resin portion.

Then, the product was cut into a piece having a predetermined size of optical semiconductor devices, to complete an optical semiconductor device of Embodied Example 1.

Embodied Example 2 to Embodied Example 7

In Embodied Example 2, a lead frame, a resin-equipped lead frame, and an optical semiconductor device were fabricated in the same manner as in Embodied Example 1 except that the thickness of the glossy Ni plating layer was 0.5 μm.

In Embodied Example 3, a lead frame, a resin-equipped lead frame, and an optical semiconductor device were fabricated in the same manner as in Embodied Example 1 except that the thickness of the glossy Ni plating layer was 3.0 μm.

In Embodied Example 4, a lead frame, a resin-equipped lead frame, and an optical semiconductor device were fabricated in the same manner as in Embodied Example 1, except that adjustment was made so that a surface roughness in terms of Ra of the glossy Ni plating layer be 0.02 μm, the gloss of the glossy Ni coating surface be 3.1, and the gloss at the Ag coating surface be 2.1.

In Embodied Example 5, a lead frame, a resin-equipped lead frame, and an optical semiconductor device were fabricated in the same manner as in Embodied Example 1, except that adjustment was made so that the surface roughness in terms of Ra of the glossy Ni plating layer be Ra 0.05 μm, the gloss at the glossy Ni plating surface be 3.1, the thickness of the Ag plating layer be 0.9 μm, and the gloss at the Ag plating surface be 2.1.

In Embodied Example 6, a lead frame, a resin-equipped lead frame, and an optical semiconductor device were fabricated in the same manner as in Embodied Example 1 except that adjustment was made so that the thickness of the Ag plating layer be 0.3 μm and the gloss at the Ag coating surface was 2.2.

In Embodied Example 7, a lead frame, a resin-equipped lead frame, and an optical semiconductor device were fabricated in the same manner as in Embodied Example 1 except that adjustment was made so that the thickness of the Ag plating layer be 2.5 μm and the gloss at the Ag coating surface be 1.9.

Embodied Example 8

In Embodied Example 8, a lead frame was fabricated by means of the pre-plating method in which a metal plate was first plated at predetermined sites and then a pattern of a lead frame was formed, not by the post-plating method adopted in Embodied Example 1.

To be specific, first, as a metal plate for forming a lead frame, a Cu plate having a thickness of 0.2 mm was processed into a long plate having a width of 140 mm, and then a photosensitive dry film resist having a thickness of 0.05 mm was applied to the both sides of the metal plate with a laminating roll.

Then, the dry film resist was covered, on the front side, with a glass mask that carried a pattern for a die pad portion and a lead portion and, on the back side, with a glass mask that carried a pattern for an external terminal portion, and then was exposed to ultraviolet light. Thereafter, using a sodium carbonate solution, development treatment was performed to dissolve uncured dry film resist that failed to be irradiated with ultraviolet light and was left unaffected.

Then, exposed faces of the metal plate at openings from which the resist layer had been removed underwent glossy Ni plating. The glossy Ni plating was performed at a current density of 5 A/dm$^2$ using a sulfamic acid-based plating solution to which an appropriate amount of a brightening agent containing sulfur was added. The plating conditions were appropriately adjusted so that, with the glossy Ni plating layer having the thickness of 2.0 μm and the surface roughness in terms of Ra of 0.04 μm, the gloss at the glossy Ni coating surface was 3.0. Thereafter, a Pd coating with a thickness of 0.03 μm was applied, and then an Au coating with a thickness of 0.007 was applied. Then, an Ag coating was applied. Ag plating was performed at a current density of 7 A/dm² using a cyan-based Ag plating solution. The plating solution conditions were appropriately adjusted so that the thickness of the Ag plating layer was 1.0 μm and the gloss at the Ag coating surface was 2.0.

Then, the dry film resist was peeled off with a sodium hydroxide solution. In this way, the plating layer was formed in predetermined regions on the die pad portion and a lead portion of the metal plate. Then, a photosensitive dry film resist having a thickness of 0.05 mm was again applied to the both sides of the metal plate with a laminating roll.

Then, the dry film resist, on the front and back sides, was covered with a glass mask that carried a predetermined pattern for forming a die pad portion and a lead portion and was exposed to ultraviolet light. Thereafter, using a sodium carbonate solution, development treatment was performed to dissolve uncured dry film resist that failed to be irradiated with ultraviolet light and was left unaffected.

Then, exposed faces of the metal plate at openings from which the resist layer had been removed were etched. A ferric chloride solution was used as an etching solution. Thereby, the shapes of the die pad portion and the lead portion were formed. Then, the dry film resist was peeled off with a sodium hydroxide solution.

Thereafter, a lead frame of Embodied Example 8 was completed as cut into a piece of predetermined size.

After that, in the same manner as in Embodied Example 1, a resin-equipped lead frame and an optical semiconductor device were fabricated.

Comparative Example 1

In Comparative Example 1, Ni plating was performed without adding a brightener to the sulfamic acid-based plating solution used in the glossy Ni plating of Embodied Example 1. The glossiness at the Ni coating surface was 1.8, the surface roughness in terms of Ra of the Ni plating layer was 0.07 μm, the thickness of the Ag plating layer was 3.0 μm, and the glossiness at the Ag coating surface was 1.5. Other than the above, a lead frame, a resin-equipped lead frame, and an optical semiconductor device were fabricated in the same manner as in Embodied Example 1.

Comparative Example 2, Comparative Example 3

In Comparative Example 2, a lead frame, a resin-equipped lead frame, and an optical semiconductor device were fabricated in the same manner as in Embodied Example 1 except that the surface roughness in terms of Ra of the glossy Ni coating is 0.01 μm, the gloss at the glossy Ni coating surface is 3.6, and the gloss at the Ag coating surface is 2.7.

In Comparative Example 3, a lead frame, a resin-equipped lead frame, and an optical semiconductor device were fabricated in the same manner as in Embodied Example 1 except that the surface roughness in terms of Ra of the glossy Ni coating is 0.06 μm, the gloss at the glossy Ni coating surface is 1.9, and the gloss at the Ag coating surface is 1.5.

Evaluation of Plating Unevenness on Coating Surface and Evaluation of Manufacturing Cost Each 1000 products of the respective lead frames of Embodied Examples 1 to 8 and Comparative Examples 1 to 3 were prepared, and appearance of the coating surface of the products was inspected at the lead frame preparation stage by using an automatic appearance inspection apparatus to evaluate presence or absence of plating unevenness.

The evaluation results are shown in Table 1. Regarding the incidence of plating unevenness, a value less than 0.3% was evaluated "A", a value in the range of 0.3% to 1% was evaluated "B", and a value over 1% was evaluated "C". Further, the manufacturing cost of the lead frame of Examples 1 to 8 and Comparative Examples 1 to 3 were also evaluated. The cost evaluation was based on the price of used chemicals for plating and precious metals, as compared with the conventional ones. A cost lower than the conventional ones was evaluated "A", a cost equivalent to the conventional ones was evaluated "B", and a cost higher than the conventional ones was evaluated "C".

With respect to the criterion for price of chemicals for plating, "conventional ones" is defined as "those having a gloss of 2.0 or less (generally, gloss is in the range of 1.0 to 1.5) at the Ni coating surface by using an Ni plating solution not containing a brightener.

With respect to the criterion for price of noble metals, "conventional ones" is defined as "those having an Ag plating layer with a thickness of 2.5 μm or more (generally, the thickness is in the range of 2.5 to 5.0 μm).

Further, for each of the lead frames of Embodied Examples 1 to 8 and Comparative Examples 1 to 3, the crystalline orientation of the glossy Ni plating layer (in the case of Comparative Example 1, Ni plating layer) and the reflectance at the surface of the Ag plating layer for 460 μm were examined.

Regarding the crystalline orientation of the glossy Ni plating layer (in the case of Comparative Example 1, Ni plating layer), each lead frame had been heated at 200° C. for two hours to be used as a subject of examination in consideration of the heating environment in the manufacturing process of a resin-equipped lead frame or an optical semiconductor device. For each subject, from X-ray diffraction from the surface of the Ag plating layer in laminate state, diffraction intensities for plane indices in the glossy Ni plating layer (in the case of Comparative Example 1, Ni plating layer) were detected by an X-ray diffractometer, and the dominant orientation was derived from the detected result.

In Table 1, the column for crystalline orientation of the glossy Ni plating layer (in the case of Comparative Example 1, Ni plating layer) shows, for each Example, a plane index that was dominant in diffraction intensity between the plane index (111) and the plane index (200).

The reflectance at the surface of the Ag plating layer is expressed by a value which is a sum of regular reflectance and diffuse reflectance obtained by use of a reflectometer.

As shown in Table 1, in each of the lead frames of Embodied Examples 1 to 8, the incidence of plating unevenness was less than 0.3%, and the cost was lower than that of the conventional ones.

On the other hand, in the lead frame of Comparative Example 1, the incidence of defects in appearance caused by plating unevenness was about 4%, the amount of precious metal to be used was also large, and the cost was high.

In the lead frame of Comparative Example 2, although the incidence of plating unevenness was inconsiderable as compared to the lead frame of Comparative Example 1, it was higher than those of the lead frames of Embodied Examples 1 to 8. In addition, the amount of chemicals used was large, and the cost was high.

In addition, although the lead frame of Comparative Example 3 costed low, the glossy Ni plating layer had a course surface roughness and a low gloss, the gloss at the Ag coating surface was below 1.6, and accordingly defects in appearance caused by plating unevenness occurred as much as 3%.

TABLE 1

| | glossy Ni coating | | | | Ag coating | | | |
| | Ni coating | | | | | | | |
| | surface | | | | | | | |
| | gloss | roughness Ra(μm) | thickness (μm) | crystalline orientation | gloss | thickness (μm) | reflectance (%) | plating unevenness | cost |
|---|---|---|---|---|---|---|---|---|---|
| embodied example 1 | 3.0 | 0.04 | 2.0 | (111) | 2.0 | 1.0 | 94 | A | A |
| embodied example 2 | 3.0 | 0.04 | 0.5 | (111) | 2.0 | 1.0 | 94 | A | A |
| embodied example 3 | 3.0 | 0.04 | 3.0 | (111) | 2.0 | 1.0 | 94 | A | A |
| embodied example 4 | 3.1 | 0.02 | 2.0 | (111) | 2.1 | 1.0 | 94 | A | A |
| embodied example 5 | 3.1 | 0.05 | 2.0 | (111) | 2.1 | 0.9 | 93 | A | A |
| embodied example 6 | 3.0 | 0.04 | 2.0 | (111) | 2.2 | 0.3 | 93 | A | A |
| embodied example 7 | 3.0 | 0.04 | 2.0 | (111) | 1.9 | 2.5 | 94 | A | A |
| embodied example 8 | 3.0 | 0.04 | 2.0 | (111) | 2.0 | 1.0 | 94 | A | A |
| comparative example 1 | 1.8 | 0.07 | 2.0 | (200) | 1.5 | 3.0 | 85 | C | C |
| comparative example 2 | 3.6 | 0.01 | 2.0 | (111) | 2.7 | 1.0 | 94 | B | C |
| comparative example 3 | 1.9 | 0.06 | 2.0 | (111) | 1.5 | 1.0 | 94 | C | A |

Further, the present inventor was able to produce the resin-equipped lead frames and the optical semiconductor devices using the lead frames of Examples 1 to 8 without any problem in the process.

These experiments and examination have proved that lead frames, resin-equipped lead frames, and optical semiconductor devices of Embodied Examples 1 to 8 contributed to maintaining the gloss of the coating surface at 1.6 or more, preventing defects in appearance such as unevenness of the coating surface, and allowing the coating thickness of noble metals to be thin for cost reduction, as a result of being provided with the configuration in which a Ni plating layer formed of a glossy coating having a gloss of 2.0 or more and 3.5 or less and a noble metal plating layer including an Ag plating layer having a gloss of 1.6 or more and arranged as the uppermost layer are made to laminate the surface on the lead frame substrate.

Although each embodiment and each embodied example of the present invention have been described in detail as described above, the lead frame, the resin-equipped lead frame, the optical semiconductor device, and the method for manufacturing the lead frame of the present invention may have many variations as long as not substantially deviating from the essential subject matter. Such variations are to be included within the scope of the present invention.

For example, in the specification and the drawings, terms referred to together with broader or synonymous different terms at least once can be replaced with the different terms anywhere in the specification or the drawings. Further, the lead frame, the resin-equipped lead frame, the optical semiconductor device, the manufacturing method and operation of the lead frame are not limited to those described in the embodiments and embodied examples of the present invention, and various modifications are available.

What is claimed is:

1. A lead frame for use in an optical semiconductor device, comprising:
    a die pad portion on which an optical semiconductor element is to be mounted; and
    a lead portion electrically connectable with the optical semiconductor element;
    wherein a surface on a lead frame substrate forming at least a part of or an entirety of the die pad portion and the lead portion is laminated with plating layers including a glossy Ni plating layer having a gloss of 2.0 or more and 3.5 or less and a noble metal plating layer including an Ag plating layer having a gloss of 1.6 or more and arranged as an uppermost layer, and
    wherein a crystalline orientation of the glossy Ni plating layer is such that the plane index (111) is dominant over the plane index (200).

2. The lead frame according to claim 1, wherein a surface roughness in terms of Ra of the glossy Ni plating layer is in a range of 0.02 μm to 0.05 μm, inclusive.

3. The lead frame according to claim 1, wherein a coating thickness of the glossy Ni plating layer is in a range of 0.5 μm to 3.0 μm, inclusive.

4. The lead frame according to claim 1, wherein a coating thickness of the Ag plating layer is in a range of 0.3 μm to 2.5 μm, inclusive.

5. The lead frame according to claim 1, wherein a reflectance at a surface of the Ag plating layer for 460 nm is 90% or more.

6. The lead frame according to claim 1, wherein, in the plating layers, the noble metal plating layer further includes an Au plating layer arranged between the glossy Ni plating layer and the Ag plating layer.

7. The lead frame according to claim 6, wherein, in the plating layers, the noble metal plating layer further includes a Pd plating layer arranged between the glossy Ni plating layer and the Au plating layer.

8. A resin-equipped lead frame comprising:
the lead frame according to claim 1; and
a reflector resin portion formed on a periphery of the die pad portion and the lead portion, to surround the surface laminated with the plating layers.

9. An optical semiconductor device comprising:
the resin-equipped lead frame according to claim 8;
an optical semiconductor element mounted on the die pad portion;
a connecting member that electrically connects the optical semiconductor element and the lead portion; and
a sealing resin portion formed of a transparent resin filling a spatial region that is surrounded by the reflector resin portion and that accommodates the optical semiconductor element and the connecting member.

10. A method for manufacturing a lead frame to be used in an optical semiconductor device, comprising:
laminating a surface on a lead frame substrate with a glossy Ni plating layer having a gloss in a range of 2.0 to 3.5, inclusive, and a noble metal plating layer including an Ag plating layer that has a gloss of 1.6 or more and that is arranged as an uppermost layer, the surface being of at least a part of or an entirety of sites that correspond to a die pad portion on which an optical semiconductor element is to be mounted and a lead portion electrically connectable with the optical semiconductor element; and
forming the die pad portion and the lead portion after the surface, on the lead frame substrate, of at least a part of or an entirety of the sites that correspond to the die pad portion and the lead portion is laminated with the glossy Ni plating layer having the gloss in the range of 2.0 to 3.5, inclusive, and the noble metal plating layer including the Ag plating layer, which has the gloss of 1.6 or more and is arranged as the uppermost layer.

11. The method according to claim 10 for manufacturing a lead frame to be used in an optical semiconductor device, wherein the glossy Ni plating is formed to have a surface roughness expressed in Ra in a range of 0.02 µm to 0.05 µm, inclusive.

12. The method according to claim 10, wherein a plating bath used in forming the glossy Ni plating layer is a sulfamic acid bath to which a brightening agent containing sulfur is added, at a current density of 3 to 10 A/dm².

* * * * *